United States Patent
Dalban Pilon et al.

(10) Patent No.: US 9,952,271 B2
(45) Date of Patent: Apr. 24, 2018

(54) INSULATION MONITORING SYSTEM FOR SECURED ELECTRIC POWER SYSTEM

(71) Applicant: SCHNEIDER ELECTRIC INDUSTRIES SAS, Rueil Malmaison (FR)

(72) Inventors: Bernard Dalban Pilon, Bernin (FR); Franck Gruffaz, Seyssins (FR)

(73) Assignee: SCHNEIDER ELECTRIC INDUSTRIES SAS, Rueil Malmaison (FR)

( * ) Notice: Subject to any disclaimer, the term of this patent is extended or adjusted under 35 U.S.C. 154(b) by 820 days.

(21) Appl. No.: 13/837,587

(22) Filed: Mar. 15, 2013

(65) Prior Publication Data

US 2013/0268216 A1    Oct. 10, 2013

(30) Foreign Application Priority Data

Apr. 6, 2012    (FR) ..................... 12 01039

(51) Int. Cl.
| | | |
|---|---|---|
| G01R 31/08 | (2006.01) | |
| G01R 27/18 | (2006.01) | |
| G01R 31/02 | (2006.01) | |
| H02H 3/16 | (2006.01) | |

(Continued)

(52) U.S. Cl.
CPC ............. G01R 31/08 (2013.01); G01R 27/18 (2013.01); G01R 31/025 (2013.01); G01R 31/086 (2013.01); H02H 3/167 (2013.01); H02H 3/17 (2013.01); H02H 3/33 (2013.01)

(58) Field of Classification Search
CPC .... G01R 27/16; G01R 31/086; G01R 31/025; H02H 1/0015; H02H 9/02; H02H 9/08; Y04S 10/522; H04L 67/12; H01F 27/402
USPC .... 324/500, 509, 525, 521, 547; 361/42, 44, 361/79, 63; 702/58, 59, 65, 60, 64
See application file for complete search history.

(56) References Cited

U.S. PATENT DOCUMENTS

| | | |
|---|---|---|
| 5,101,160 A | 3/1992 | Barjonnet et al. |
| 5,272,440 A | 12/1993 | Weynachter et al. |
| (Continued) | | |

FOREIGN PATENT DOCUMENTS

| | | |
|---|---|---|
| DE | 198 26 410 A1 | 1/1999 |
| DE | 103 07 972 A1 | 9/2004 |
| (Continued) | | |

OTHER PUBLICATIONS

FR2963679, Aug. 2010, Francois, 22 pp.*

(Continued)

*Primary Examiner* — Roy Y Yi
*Assistant Examiner* — Jeffrey Aiello
(74) *Attorney, Agent, or Firm* — Oblon, McClelland, Maier & Neustadt, L.L.P.

(57) ABSTRACT

The detection of an insulation fault on a network furnished with tappings by a first monitor can be followed by the location and identification of the fault by way of a locator to be placed on the tappings. To satisfy the level-two security, or SIL-2, in which the risk of occurrence of a hazard is decreased by a factor of greater than 100, second means for detecting the insulation fault are installed, to obtain a redundant item of information as regards the insulation resistance of the network, independently of the monitor but associated with a locator.

20 Claims, 2 Drawing Sheets

(51) Int. Cl.
*H02H 3/17* (2006.01)
*H02H 3/33* (2006.01)

(56) References Cited

U.S. PATENT DOCUMENTS

| | | | | |
|---|---|---|---|---|
| 5,341,265 | A * | 8/1994 | Westrom | H02H 1/0015 |
| | | | | 361/44 |
| 5,650,728 | A * | 7/1997 | Rhein | G01R 31/021 |
| | | | | 324/534 |
| 5,682,101 | A * | 10/1997 | Brooks | H01H 71/125 |
| | | | | 324/520 |
| 6,154,036 | A * | 11/2000 | Baldwin | G01R 31/086 |
| | | | | 324/509 |
| 6,313,641 | B1 * | 11/2001 | Brooks | G01R 31/025 |
| | | | | 324/424 |
| 6,385,234 | B1 * | 5/2002 | Ashley | H04L 5/1423 |
| | | | | 375/219 |
| 6,392,422 | B1 | 5/2002 | Kammer et al. | |
| 8,315,379 | B2 * | 11/2012 | Masuda | H04B 3/20 |
| | | | | 379/406.08 |
| 8,680,872 | B2 * | 3/2014 | Nowicki | G01R 31/085 |
| | | | | 324/509 |
| 2006/0125486 | A1 * | 6/2006 | Premerlani | G01R 31/086 |
| | | | | 324/512 |
| 2007/0001793 | A1 * | 1/2007 | Magnier | H01F 27/402 |
| | | | | 336/90 |
| 2008/0084215 | A1 * | 4/2008 | Itten | G01R 27/18 |
| | | | | 324/510 |
| 2008/0309351 | A1 * | 12/2008 | Stewart | G01R 31/1272 |
| | | | | 324/551 |
| 2009/0212965 | A1 * | 8/2009 | Becattini | H02H 3/14 |
| | | | | 340/660 |
| 2012/0086459 | A1 * | 4/2012 | Kim | G01R 29/18 |
| | | | | 324/522 |
| 2013/0107410 | A1 * | 5/2013 | Rolli | G01R 27/2694 |
| | | | | 361/91.1 |
| 2013/0191059 | A1 * | 7/2013 | Legros | G01R 19/0007 |
| | | | | 702/65 |
| 2013/0342948 | A1 * | 12/2013 | Jankowski | H02H 9/02 |
| | | | | 361/93.9 |

FOREIGN PATENT DOCUMENTS

| | | | |
|---|---|---|---|
| EP | 0 593 007 A2 | 4/1994 | |
| EP | 2 006 694 A1 | 12/2008 | |
| FR | 2 647 220 A1 | 11/1990 | |
| FR | 2 676 821 A1 | 11/1992 | |
| FR | 2 917 838 A1 | 12/2008 | |
| FR | 2963679 * | 8/2010 | ............ G01R 31/08 |
| FR | 2 963 679 A1 | 2/2012 | |
| KR | 20-0401675 Y1 | 11/2005 | |

OTHER PUBLICATIONS

FR2963679—English translation, Aug. 2010, Francois, pp. 1-14.*
French Preliminary Search Report dated Dec. 19, 2012, in Patent Application No. FR 1201039 (with English Translation of Category of Cited Documents).

* cited by examiner

INSULATION MONITORING SYSTEM FOR SECURED ELECTRIC POWER SYSTEM

TECHNICAL FIELD

The invention relates to the identification of the presence of an insulation fault for an electrical distribution network with insulated neutral comprising tappings. It is associated in particular with the location and the measurement of insulation faults. The invention pertains more particularly to the redundancy of the insulation monitoring in applications requiring the latter, so as to increase operating safety.

PRIOR ART

Monitoring of the insulation of a distribution network makes it possible to identify the occurrence of a fault: parameters are measured continuously, and the decrease in the insulation resistance of the network makes it possible to detect the presence of a fault so as to react, for example by alarming, and sometimes by isolating a network or a part of an electrical network. In particular, a device known by the acronym PIM, or permanent insulation monitor, is conventionally connected up to the transformer of the network so as to determine the insulation impedance and to evaluate an "abnormality" characteristic of the presence of a fault: see for example FR 2 647 220 or EP 0 593 007.

For a network furnished with tappings, it may furthermore be important to locate the fault detected at the central level by the PIM, or indeed even to ascertain its characteristics perfectly. Various schemes have been developed, in which measurement means, associated with processing and calculation means, are installed on the tappings, thus forming "locators" of insulation faults, which may be mobile or at rest: see FR 2 963 679, FR 2 676 821, FR 2 917 838.

An insulation monitoring architecture thus consists of a monitor of insulation at the level of the transformer, alone or associated with devices for fault location at the level of the outlets. However, in case of failure of the insulation monitor, even if the relays are of the oriented failure type, non-detection of a fault or conversely inappropriate triggering may occur. Now, the redundancy of the measurement equipment cannot be advocated for each apparatus and/or function, be it for technical reasons, or reasons of cost, bulkiness or available area of electronic card in the processing means.

DESCRIPTION OF THE INVENTION

Among other advantages, the invention is aimed at proposing a simple and inexpensive solution for increasing the operating safety of existing insulation monitoring systems, so as in particular to satisfy the standards IEC 61508 and IEC 61557-15.

The invention thus relates to a method of monitoring the insulation of an electrical network which has several branches downstream of a transformer, comprising the injection of a current of predetermined voltage and of different frequency from that of the network, for example 2.5 Hz for a 50-Hz three-phase network, and two independent determinations of the insulation impedance, the first by direct measurement of the injected current, the second downstream of the transformer, in particular by way of one or more tori. Each of the two impedance values is compared with one and the same threshold (for example a hundred ohms) which, when it is not reached (that is to say that the impedance is lower than it, that the current exceeds a predefined value), makes it possible to detect the occurrence of an insulation fault. To ensure maximum reliability, by preventing an injection fault from causing non-detection, the method also comprises the verification of the reality of the injection, by comparing the measurement of the current carried out downstream of the transformer with a fixed value which must be exceeded; this comparison of the measurement of the current is preferably carried out by way of the insulation impedance determined elsewhere, said impedance having to remain under a second threshold, for example of the order of 10 MΩ. The method can comprise the illuminating of a telltale light or the activating of a relay; preferably, the indication is differentiated so as to identify which comparison result is problematic.

The method also comprises the monitoring of the insulation for the branches, by way of a similar comparison of the insulation impedance of the branches, determined on the basis of the measurement of the current at the injection frequency flowing therein, with a threshold which can be fixed for each branch, in particular between 10 kΩ and 1 MΩ. The results of the diverse comparisons may be indicated in a differentiated or common manner.

According to an option, the measurement of the current on each branch can be used to determine the current/the impedance downstream of the transformer; according to an alternative, the measurement of the current downstream of the transformer is independent and carried out by dedicated means.

The invention also pertains to an insulation monitoring system allowing the implementation of the above method. In particular, the monitoring system comprises means for injecting an alternating current signal of fixed voltage onto the part of the network upstream of the transformer, at the level of the secondary or preferably at the level of the neutral of the transformer. The monitoring system comprises a first permanent insulation monitor, with means for measuring the intensity of the injected current and for determining whether or not the impedance calculated on the basis of this intensity exceeds a first threshold.

The monitoring system moreover comprises means for measuring the current at the injection frequency downstream of the transformer, and means for verifying that the measured intensity is above a threshold value, thereby making it possible to validate the proper operation of the injection means, conventionally integrated into the permanent insulation monitor. The monitoring system also comprises means for processing and calculation of the measured signal for calculating the impedance on the basis of this downstream intensity and means for determining whether or not the calculated impedance exceeds the first threshold; the result of this comparison is thus redundant, thereby making it possible to increase the security ensured by the monitoring system, in particular in applications such as nuclear power facilities or computer data centers requiring it. The verification of the intensity of the current can be carried out by way of a comparison of the calculated impedance with a second threshold.

Preferably, the monitoring system comprises means for measuring the voltage at the injection frequency downstream of the transformer, and the means for determining the impedances use this measurement.

The monitoring system furthermore comprises means for measuring the current at the injection frequency at the level of the branches, preferably of each, means for processing and calculation of the signal for calculating the impedance on the basis of this branch intensity and means for determining whether or not the calculated impedance exceeds a threshold fixed as a function of the load characteristics of the branch, so as to locate a possible insulation fault.

The locator thus formed by the measurement means, the processing and calculation means and the determination means associated with each branch is suitable for carrying out the second measurement of the current at the injection frequency, downstream of the transformer, and the processing that it undergoes. Advantageously, the determination and comparison means of the locator, element of the system downstream of the transformer, are grouped together on one and the same calculation card, for example a card with twelve pathways, which makes it possible to verify the insulation of eleven tappings in addition to global verification regarding the twelfth.

The monitoring system finally comprises means for indicating the suspicion of an insulation fault or a fault in the injection, for example telltale lights. According to one embodiment, the indications are differentiated, with an output for each type of failed comparison result detected; alternatively, the same means can be triggered irrespective of the type of failure, for example with a single telltale light illuminating for the two comparisons arising from the measurement of the current downstream of the transformer.

The invention also relates to a network secured by the above system.

BRIEF DESCRIPTION OF THE FIGURES

Other advantages and characteristics will emerge more clearly from the description which follows of particular embodiments of the invention, which are given by way of wholly non-limiting illustration and represented in the appended figures.

DETAILED DESCRIPTION OF A PREFERRED EMBODIMENT

Figure 1:
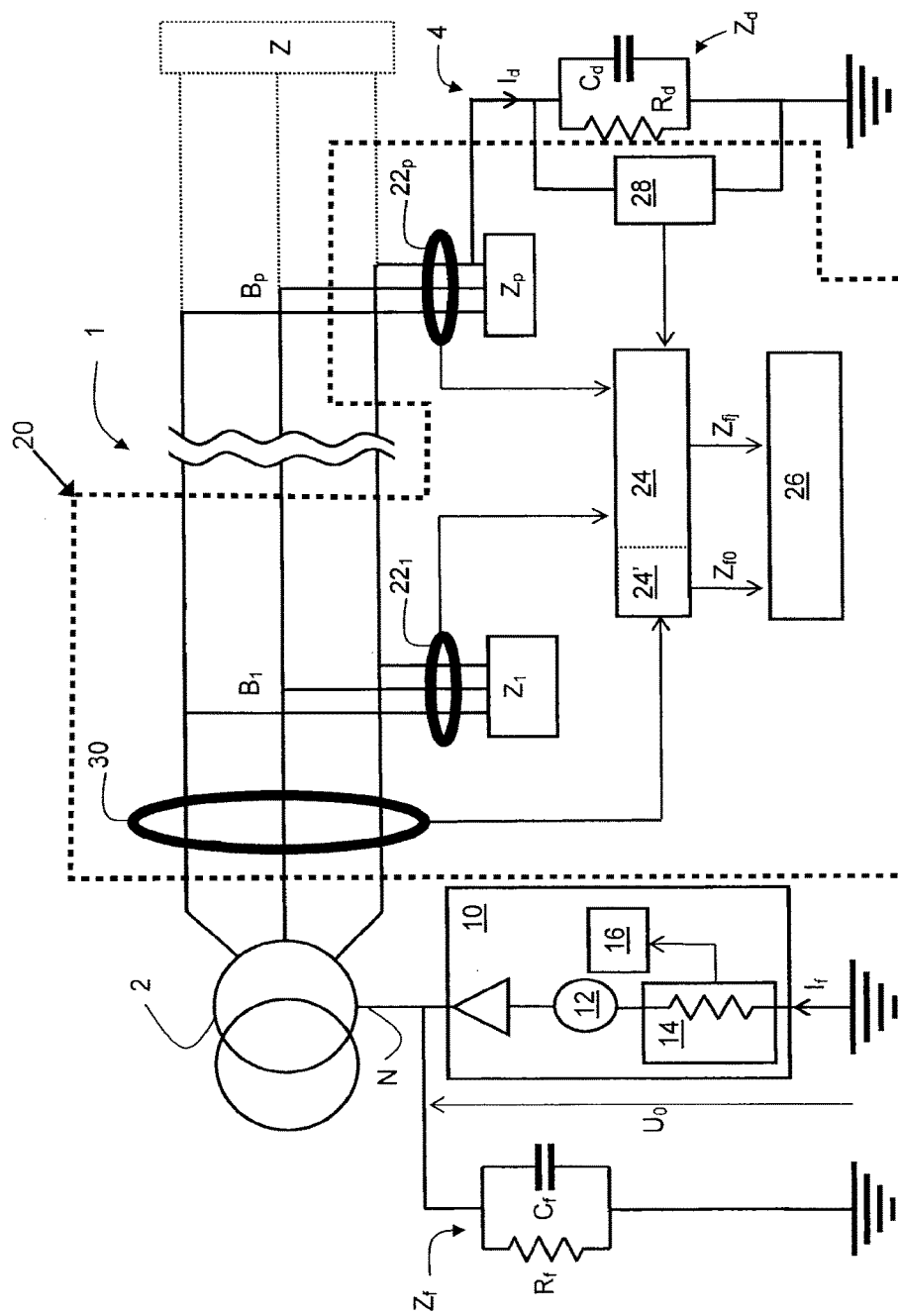
FIG. 1 illustrates a network furnished with an insulation monitoring system according to a preferred embodiment of the invention.

As illustrated in FIG. 1, the three distribution lines of a three-phase network 1 are supplied with alternating electrical power by a transformer 2; downstream of the transformer 2, the main network 1 provides electrical power to several impedances of use $Z_j$ each wired up to a three-phase branch $B_j$ (j=1→p). In particular, in an appliance according to the invention, the outlets $B_j$ are concentrated in a defined place, for example within a distribution cabinet or substation. The network 1 illustrated is of the so-called "insulated neutral" type, that is to say the neutral N of the transformer 2 is linked to earth by a resistor (or impedance) for insulating the network 1; a global resistance $R_f$ can thus be determined, consisting mainly of the insulation resistances of the cables, of the equipment, etc.

When one of the load or use impedances $Z_j$ exhibits an insulation fault 4 with respect to earth, this is manifested by the deleterious presence of a fault impedance $Z_d$ between at least one of the three phase wires or the neutral and earth. A fault impedance $Z_d$ is usually shown diagrammatically by an additional circuit comprising a resistance $R_d$ in parallel with a capacitance $C_d$; this fault impedance $Z_d$ alters (in particular decreases) the value of the "normal" insulation impedance $Z_f$ of the network 1 between the neutral terminal N of the PIM 10 and earth.

To detect and measure the presence of this type of leakage 4, a permanent insulation monitor, or PIM, 10 is for example wired between the neutral N of the transformer 2 and earth. The PIM 10 comprises means 12 for generating and injecting onto the power supply network 1 an alternating voltage $U_0$ of frequency $f_1$ which is different from and usually less than the natural frequency $F_0$ of the electrical power supply network 1, in particular a sub-multiple. The injection onto the network 1 causes the flow of a leakage current $I_f$ that it is possible to measure at the level of the PIM by measurement means 14, in particular a measurement resistance.

In the presence of the insulation fault 4, the leakage current $I_f$ flows in the fault impedance $Z_d$ and loops toward the PIM 10 through earth and the measurement means 14; when it exceeds a threshold, this current is then dubbed a fault current $I_d$ and indicates the presence of a fault 4.

Figures 2A, 2B:
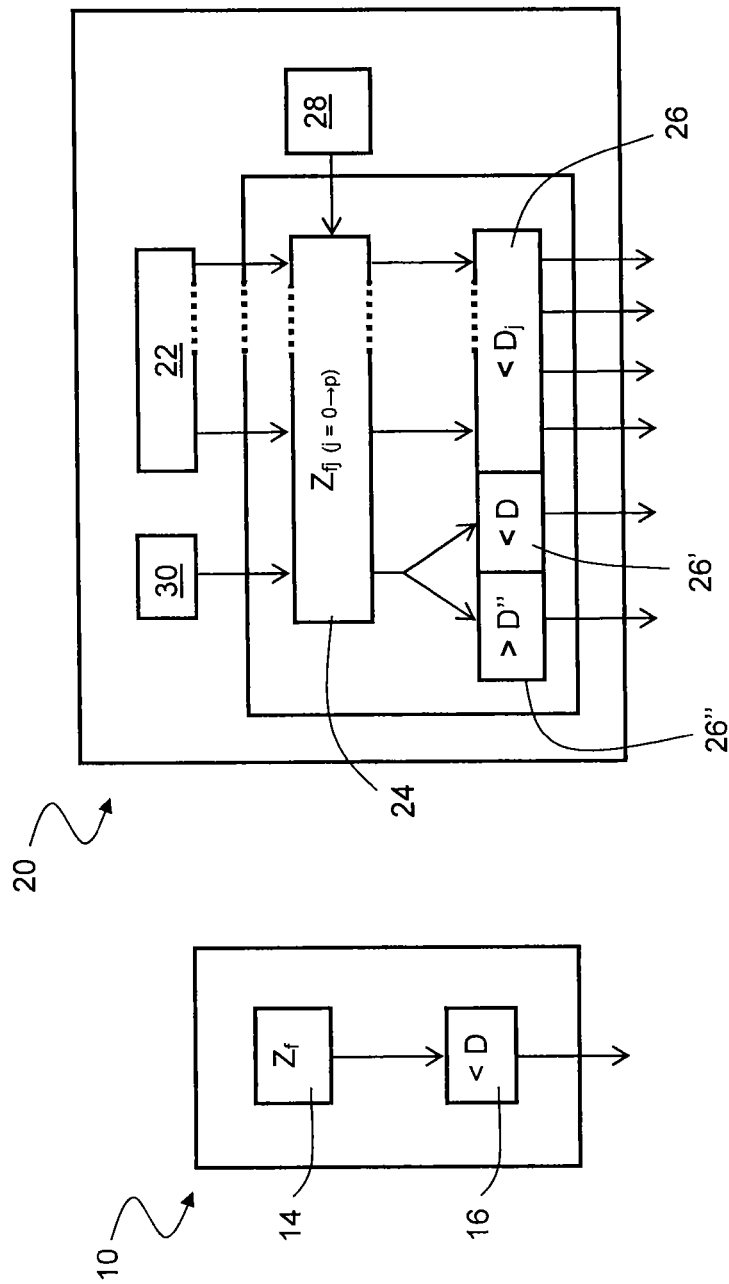
FIGS. 2A and 2B represent the upstream and downstream elements of a monitoring system according to one embodiment of the invention.

A PIM 10 thus conventionally comprises means 14 suitable for determining the values of the insulation resistance $R_f$ and capacitance $C_f$, and means 16 for determining whether these values do not correspond to the "normal" impedance of the network 1, so as to give an alarm (FIG. 2A). In particular, in case of an insulation fault 4, the global insulation impedance decreases: when it passes under a first threshold D, which may conventionally be fixed at one or a few hundred ohms, an audible and/or visual signal forewarns the user of the probable occurrence of a fault 4. Subsidiarily, means for viewing the values of general insulation impedance $Z_f$ of the network 1 can be installed, as well as means for transmitting the result to a central unit for action on the network 1 (not illustrated).

Moreover, for each of the tappings $B_j$, an insulation fault location device 20 is installed (also see FIG. 2B). In particular, means $22_j$ for measuring the local fault current transmit the representative signal to processing and calculation means 24, preferably common for all the measurement means 22; the transmission can be carried out by any means, but to make the system secure and since the application preferably relates to a compact network 2, wire-based links are preferred. The processing and calculation means 24 and/or the measurement means 22 operate, independently of the PIM 10, in a continuous or intermittent manner.

Depending on the option chosen, the locator 20 may simply indicate the presence of a fault on the outlet, for example by comparing through suitable means 26 the impedances $Z_{fj}$ calculated at each outlet $B_j$ with a threshold $D_j$ determined as a function of the characteristics of the outlet $B_j$, conventionally between 10 kΩ and 1 MΩ, and which must be exceeded when the outlet $B_j$ is healthy; alternatively, the locator gives a measurement of the insulation impedance $Z_{fj}$ through suitable means known from the prior art.

According to the invention, the network 1 is secure; in particular, the network 1 supplies critical loads Z that should not be interrupted, such as a computer center or a nuclear power facility. Thus, the insulation monitoring system 10, 20 comprises a second insulation fault based alarm circuit 4, independent of the PIM 10 and which gives a redundant item of information so as to identify a failure at the level of the PIM 10 and avoid a delay in dealing with a problem notified by this device.

As the injection function 12 and detection function 14 of a PIM 10 are tightly nested, the dual-measurement 14 of the injected current without dual-injection 12 is technically very unrealistic. According to the invention, a second measurement is therefore performed by way of the locator 20, which has an extended function in such a way that it can also perform a measurement of the insulation resistance of the complete network 1, this second measurement being redundant and independent of that performed by the PIM 10.

It is therefore also important that the locator 20, and in particular its processing and calculation means 24, are independent of the PIM 10; to this end, in the embodiment according to the invention, the location device 20 comprises means 28 for measuring the voltage downstream of the transformer 2 so as easily to calculate the impedances $Z_{fj}$ on each outlet $B_j$.

Moreover, in the preferred embodiment, to decrease to the maximum the risks of failure, independent means of measuring the injected current 30 are installed downstream of the transformer 2 and give a signal representative of the current flowing therein at the injection frequency $f_1$, so as to evaluate in a redundant manner the reality of the injection by the PIM 10. For example, when all the tappings $B_j$ are furnished with measurement means $22_j$ with an insulation fault locator 20 (in the absence of loads Z illustrated dotted in FIG. 1), the means 30 for measuring the current injected into the network 1 comprise means for summing the currents measured by the measurement means $22_j$ associated with each tapping $B_j$ (not illustrated).

However, preferably, to circumvent the build-up of measurement inaccuracies, the measurement means comprise a torus 30 around the three conductors at the transformer 2 output. This alternative allows complete independence of the redundant measurement, and increases the accuracy in the value of the measured parameter so as to evaluate earlier the reality of the operation of the PIM.

This item of information relating to the injected current measured downstream of the transformer 2 is transmitted to calculation and processing means 24' to determine the impedance $Z_{f0}$ relating thereto. In particular, the same calculation card is used for processing the two sorts of signals, that is to say the card comprises a specific input for the current arising from the global measurement means 30 and an input for the measurement $22_j$ performed on each branch $B_j$; the calculation of the global leakage impedance $Z_{f0}$ is likewise carried out in the same manner as for the other measurement means 22, in particular by way of the measurement of the voltage 28.

The result $Z_{f0}$ of this second measurement, corresponding to the redundant measurement of the insulation impedance by the measurement means situated downstream of the transformer 2, is here again compared by suitable means 26' with a threshold D, which is identical to that used for the first measurement by the PIM 10: if the threshold D is not attained, that is to say $Z_{f0}<D<$ a few $100\Omega$ and therefore the detected current greater than a "normal" leakage current, alert means are implemented, in a manner similar to what was described previously for the PIM 10. The redundancy is thus complete, whilst the only element common to the PIM 10 and to these second means 24', 26', 30 for identifying the presence of a fault 4, is the use of the injected measurement current.

In order furthermore to circumvent a problem due to a potential defect of the injection of current at the frequency $f_1$ of measurement by the PIM 10, the second measurement means 30 are also used to verify the presence of the injected current, that is to say the correct operation of the dedicated means 12. In particular, if the global current detected by the means for measuring the current 30 is below a threshold value, an alarm is triggered. The comparison can be carried out directly on the signal measured by dedicated means (not illustrated); alternatively, as indicated in FIG. 2B, the result $Z_{f0}$ of the processing and calculation of the global fault impedance is compared with a second threshold D" by suitable means 26", the exceeding of this second threshold D" by the impedance ($Z_{f0}$>D">a few 100 M$\Omega$) indicating that the injected current is insufficient. The alarm can be common for the result of the processing of the signal arising from the second measurement means 30, or differentiated, with two alarms triggered depending on whether the problem detected is the insufficiency of current or the presence of a fault.

In fact, none of the existing devices takes into account the option that the PIM 10 does not inject any current: in the existing devices, in the case of failure of the PIM, it is considered that there is no fault, the calculated impedance being infinite, and therefore always above the first threshold D.

Thus, the network 1 is equipped with a system 10, 20 for insulation fault identification and location 4 comprising preferably:

a current injector 12, operating permanently;
a central insulation monitor 10 wired up to the neutral of the transformer 2 and operating permanently;
means 22, 30 for measuring the current at the injected frequency $f_1$ downstream of the transformer 2, for permanently measuring the global current of the network 1 and the current in each branch $B_j$ of said network 1;
means 28 for measuring the voltage at the injection frequency $f_1$ downstream of the transformer 2;
means 24 for processing and calculation of the impedances downstream of the transformer 2, on the basis of the measurements of the current and of the measurement of the voltage;
means 26" for permanently determining the reality of the injection of the current by way of the downstream measurement means 30;
means 26' for permanently monitoring the insulation of the network 1 downstream of the transformer 2;
means 26 for locating insulation faults on the branches $B_j$.

The processing and calculation means 24, 26 downstream of the transformer 2 are grouped together, and totally independent of the upstream monitor 10. The system formed by the PIM 10 and the location means 20 modified according to the invention, makes it possible to improve the Safety Integrity Level (SIL) as defined in the standards IEC 61508 and IEC 61557-15 by incrementing the Hard Fault Tolerance HFT of the Local Insulation Warning LIW function and Remote Insulation Warning RIW function. In particular, the characteristics of the monitoring system 10, 20 are defined so as to satisfy the SIL-2 criterion, that is to say to reduce by a factor of 100 to 1000 the risk of occurrence of a hazard, or indeed the SIL-3 criterion (reduction by a factor of 1000 to 10000), doing so in a manner that is inexpensive and frugal in terms of calculation resources and/or processing means, without extra hardware (the occurrence of a hazard corresponding here to the non-detection of a first fault on the network 1 having as potential consequence an electric shock or a critical power supply loss if a second fault arises whilst the first fault has not been eliminated).

Although the invention has been described with reference to a three-phase network 1 to the neutral N of which is wired up the injection 12 of the permanent insulation monitoring system 10, 20, it is not limited thereto: the proposed solution can be applied to different power supplies, for example of frequency other than 50 Hz or single-phase, or backup sets such as electric-generator or inverter sets or DC voltage sources, and/or the injection device 12 can inject its signal onto a phase of the network. The various identification, location and calculation schemes can be used: for example, the injection means 12 can be suitable for simultaneous or consecutive injections at several frequencies, to any type of injected signal and the measurement and processing means 22, 30 likewise etc.

The invention claimed is:

1. A monitoring system for monitoring an insulation fault in a network comprising a transformer and a plurality of tappings that are provided downstream of the transformer, said monitoring system comprising:
   a first permanent insulation monitor provided upstream of the transformer, the first permanent insulation monitor configured to:
      inject a first alternating current signal of a predetermined voltage at a first frequency,
      determine whether a first impedance value calculated as a function of a measured alternating current upstream of the transformer is below a first threshold, and
      indicate that the insulation fault exists in the network based on a determination that the first impedance value is below the first threshold; and
   a second permanent insulation monitor provided downstream of the transformer and independent of the first permanent insulation monitor, the second permanent insulation monitor configured to:
      measure a current value of a second alternating current signal having the first frequency in the network downstream of the transformer as a downstream current signal;
      determine whether the current value of the downstream current signal is below a second threshold;
      calculate a second impedance value as a function of the downstream current signal;
      determine whether the second impedance value is below the first threshold; wherein
      a fault is indicated in the network when the first permanent insulation monitor provided upstream of the transformer indicates that the insulation fault exists in the network or when the second permanent insulation monitor provided downstream of the transformer determines that the second impedance value is below the first threshold or that the current value of the downstream current signal is below the second threshold.

2. The monitoring system as claimed in claim 1, wherein the second permanent insulation monitor is further configured to indicate whether the second impedance value is below the first threshold or whether the current value of the downstream current signal is below the second threshold.

3. The monitoring system as claimed in claim 1, wherein the second permanent insulation monitor is further configured to compare the second impedance value with the second threshold.

4. The monitoring system claim 1, wherein the second permanent insulation monitor further comprises a detection torus placed around lines of the network downstream of the transformer.

5. The monitoring system as claimed in claim 4, wherein the second permanent insulation monitor is further configured to measure a voltage of a signal having the first frequency downstream of the transformer and to calculate the second impedance value based on a value of the voltage.

6. The monitoring system as claimed in claim 1 further comprising a plurality of locators at the plurality of the tappings, wherein
   a locator at one of the plurality of the tappings is configured to:
      measure the second alternating current signal having the first frequency at the one of the plurality of the tappings,
      process and calculate a third impedance value as a function of the measured second alternating current signal,
      determine whether the calculated third impedance value exceeds a respective threshold provided for the one of the plurality of the tappings, and
   said monitoring system is further configured to indicate that the insulation fault exists when the respective threshold is exceeded.

7. The monitoring system as claimed in claim 6, wherein a plurality of thresholds are provided for the plurality of the tappings and each threshold among the plurality of thresholds is not mutually equal.

8. The monitoring system as claimed in claim 7, wherein the locator is further configured to indicate which threshold from among the first threshold, the second threshold and each of the plurality of thresholds is exceeded or not met.

9. The monitoring system as claimed in claim 6, wherein the locator is further configured to determine whether the downstream current signal having the first frequency exceeds a third threshold and to compare the third impedance value with the second threshold.

10. The monitoring system as claimed in claim 6, wherein the processing and calculation of the third impedance value are common to all the plurality of locators of the monitoring system.

11. The monitoring system as claimed in claim 6, wherein the locator further comprises a card with several pathways.

12. The monitoring system as claimed in claim 11, wherein the card comprises an input pathway for calculating the second impedance value and other pathways for calculating an impedance of each branch.

13. The monitoring system as claimed in claim 6, wherein the locator is further configured to sum all intensities detected by the plurality of locators.

14. The monitoring system claim 6, wherein the locator further comprises a detection torus placed around lines of the network downstream of the transformer.

15. The monitoring system as claimed in claim 6, wherein the locator is further configured to measure a voltage of a signal having the first frequency downstream of the transformer and to calculate the third impedance value based on a value of the voltage.

16. A method of monitoring presence of an insulation fault on a three-phase electrical network with a plurality of branches that are provided downstream of a transformer comprising:
   injecting, by a first permanent insulation monitor provided upstream of the transformer, a first alternating current signal of a predetermined voltage at a first frequency different from a frequency of the network upstream of the transformer;
   determining, by the first permanent insulation monitor, whether a first impedance value calculated as a function of a measured alternating current upstream of the transformer is below a first threshold;
   indicating, by the first permanent insulation monitor, that the insulation fault exists in the network based on a determination that the first impedance value is below the first threshold;
   measuring, by a second permanent insulation monitor provided downstream of the transformer and independent of the first permanent insulation monitor, a current value of a second alternating current signal having the first frequency in the network downstream of the transformer as a downstream current signal;

determining, by the second permanent insulation monitor, whether the current value of the downstream current signal is below a second threshold;

calculating, by the second permanent insulation monitor, a second impedance value as a function of the downstream current signal at the first frequency;

determining, by the second permanent insulation monitor, whether the second impedance value is below the first threshold; and indicating that a fault exists in the network when the first permanent insulation monitor provided upstream of the transformer indicates that the insulation fault exists in the network or when the second permanent insulation monitor provided downstream of the transformer determines that the second impedance value is below the first threshold or that the current value of the downstream current signal is below the second threshold.

17. The monitoring method as claimed in claim 16 furthermore comprising determining, by a locator at one of the plurality of branches, insulation impedance at each branch of the plurality of branches and comparing, by the locator, said insulation impedance with a threshold of each branch.

18. A secure electrical network comprising a three-phase transformer supplying a plurality of tappings, said network being equipped with a monitoring system as claimed in claim 1.

19. A monitoring system for monitoring an insulation fault in a network comprising a transformer and a plurality of tappings that are provided downstream of the transformer, said monitoring system comprising:
  a first permanent insulation monitor provided upstream of the transformer, the first permanent insulation monitor configured to:
    inject a first alternating current signal of a predetermined voltage at a first frequency,
    determine whether a first impedance value calculated as a function of a measured alternating current upstream of the transformer is below a first threshold, and
    indicate that the insulation fault exists in the network based on a determination that the first impedance value is below the first threshold; and
  a second permanent insulation monitor provided downstream of the transformer and independent of the first permanent insulation monitor, the second permanent insulation monitor comprising:
    a detection torus placed around lines of the network downstream of the transformer configured to measure a current value of a second alternating current signal having the first frequency downstream of the transformer as a downstream current signal, and
    a card with several processing and calculation pathways, and the second permanent insulation monitor configured to:
    measure a voltage of the second alternating current signal having the first frequency downstream of the transformer as a downstream voltage;
    determine whether the current value of the downstream current signal having the first frequency is below a second threshold, wherein the card is configured to:
    calculate a second impedance value as a function of the measured current value of the downstream current signal and of the measured downstream voltage;
    determine whether the second impedance value is below the first threshold; wherein
    a fault is indicated in the network when the first permanent insulation monitor provided upstream of the transformer indicates that the insulation fault exists in the network or when the second permanent insulation monitor provided downstream of the transformer determines that the second impedance value is below the first threshold or that the current value of the downstream current signal is below the second threshold.

20. The monitoring system as claimed in claim 19, wherein
  each tapping of the network comprises a locator is configured to:
    measure the second alternating current signal having the first frequency at a level of the each tapping,
    process and calculate a third impedance value as a function of the second alternating current signal,
    determine whether the calculated third impedance value exceeds a respective threshold, and
    indicate whether the respective threshold is exceeded, and
  the card of said insulation monitoring system comprises an input pathway for calculating the second impedance value and other pathways for calculating an impedance of the each tapping.

* * * * *

UNITED STATES PATENT AND TRADEMARK OFFICE
CERTIFICATE OF CORRECTION

PATENT NO. : 9,952,271 B2  
APPLICATION NO. : 13/837587  
DATED : April 24, 2018  
INVENTOR(S) : Bernard Dalban Pilon et al.

Page 1 of 1

It is certified that error appears in the above-identified patent and that said Letters Patent is hereby corrected as shown below:

In the Claims

In Column 7, Line 54, Claim 4, after "system" insert -- as claimed in --.

In Column 8, Line 39, Claim 14, after "system" insert -- as claimed in --.

Signed and Sealed this
Third Day of September, 2019

Andrei Iancu
*Director of the United States Patent and Trademark Office*